(12) United States Patent
Hwang et al.

(10) Patent No.: US 7,440,340 B2
(45) Date of Patent: Oct. 21, 2008

(54) OUTPUT BUFFER OF A SEMICONDUCTOR MEMORY DEVICE

(75) Inventors: Sang-Joon Hwang, Seoul (KR); Dong-Jin Lee, Seoul (KR); Jung-Bae Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 37 days.

(21) Appl. No.: 11/252,535

(22) Filed: Oct. 18, 2005

(65) Prior Publication Data

US 2006/0083079 A1    Apr. 20, 2006

(30) Foreign Application Priority Data

Oct. 19, 2004   (KR)   ............ 10-2004-0083402
Aug. 30, 2005   (KR)   ............ 10-2005-0080000

(51) Int. Cl.
*G11C 5/14*     (2006.01)
(52) U.S. Cl. ................. 365/189.09; 365/189.11; 365/191
(58) Field of Classification Search ........... 365/189.09, 365/189.05, 189.11, 193, 191
See application file for complete search history.

(56) References Cited

U.S. PATENT DOCUMENTS

| | | | |
|---|---|---|---|
| 6,084,434 A | 7/2000 | Keeth | 326/87 |
| 6,288,971 B1 * | 9/2001 | Kim | 365/233 |
| 6,351,172 B1 * | 2/2002 | Ouyang et al. | 327/333 |
| 6,674,313 B2 * | 1/2004 | Kurisu et al. | 327/108 |
| 6,791,888 B2 * | 9/2004 | Kang | 365/193 |
| 6,947,334 B2 * | 9/2005 | Shin | 365/189.01 |
| 6,950,370 B2 * | 9/2005 | Lee | 365/233 |
| 2003/0193351 A1 | 10/2003 | Fukui | 326/83 |

FOREIGN PATENT DOCUMENTS

| | | |
|---|---|---|
| JP | 2001-84773 | 3/2001 |
| JP | 2002-94365 | 3/2002 |
| KR | 2002-0037525 | 5/2002 |
| KR | 2003-0091233 | 12/2003 |

* cited by examiner

*Primary Examiner*—Pho M. Luu
(74) *Attorney, Agent, or Firm*—Mills & Onello, LLP

(57) ABSTRACT

A data output buffer includes an output terminal, a buffer and a pull-down driver. The output terminal is coupled to a first end of a transmission line, the transmission line being coupled to a pull-up termination resistor at a second end. The buffer pulls up the output terminal to a first power supply voltage and pulls down the output terminal to a second power supply voltage based on an output data signal. The pull-down driver pre-emphasizes an initial stage of a pull-down driving operation of the output terminal based on the output data.

22 Claims, 11 Drawing Sheets

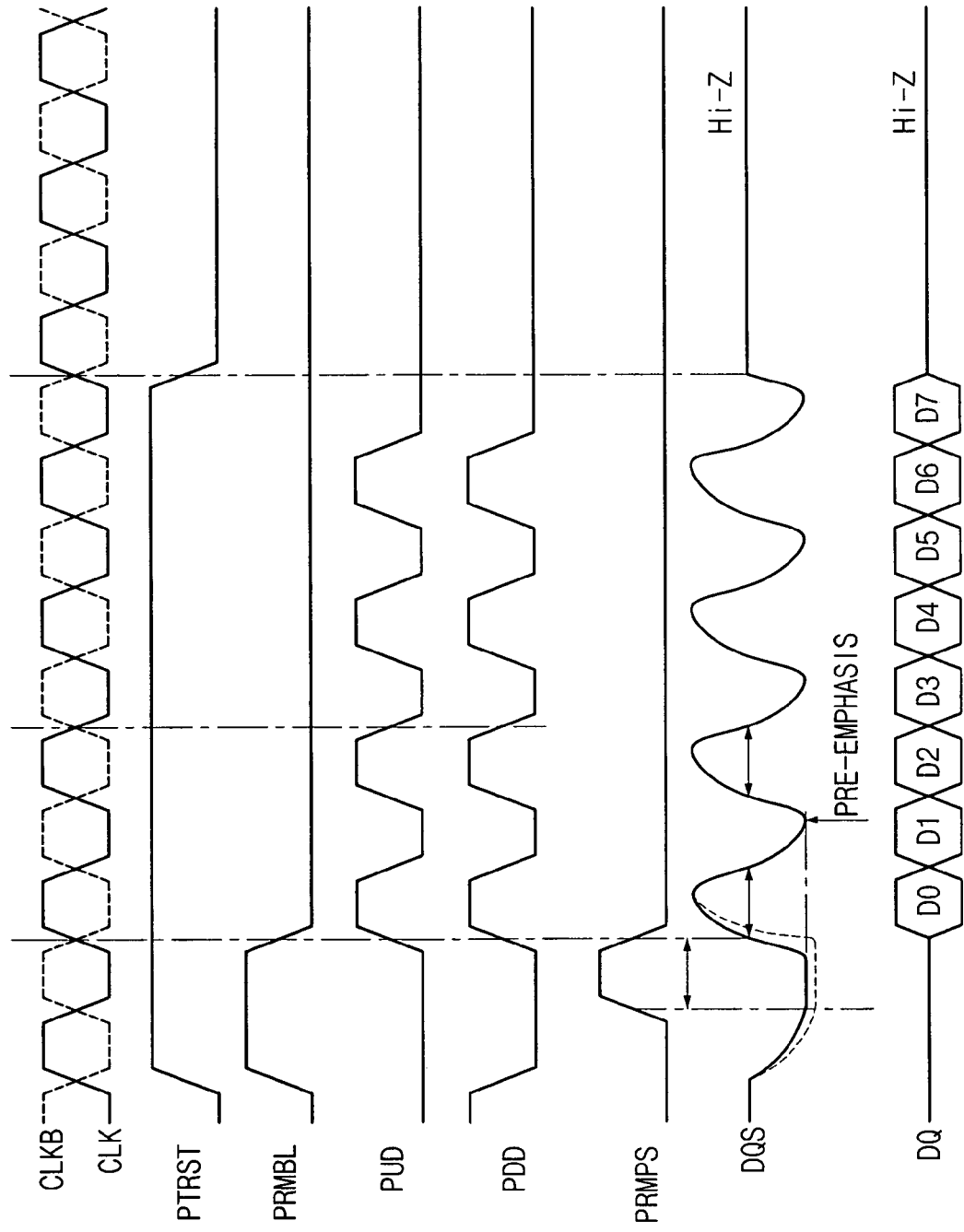

OUTPUT BUFFER OF A SEMICONDUCTOR MEMORY DEVICE

CLAIM FOR PRIORITY

This application claims priority under 35 USC § 119 to Korean Patent Application No. 2004-83402 and Korean Patent Application No. 2005-80000, filed on Oct. 19, 2004 and Aug. 30, 2005, respectively, the contents of each of which are herein incorporated by reference in their entirety for all purposes.

BACKGROUND OF THE INVENTION

1. Field of the Invention

The present invention relates to a data strobe output buffer and a memory device, and more particularly to a data output buffer, data strobe output buffer and a memory device performing a pre-emphasis function for compensating for data loss on a transmission line.

2. Description of the Related Art

As operating speeds of a computer system and a network system continue to increase, memory devices such as DRAM devices require an ever-larger large capacity and require operation at higher rates. In a computer system, a central processing unit (CPU) and memory are interconnected via a memory controller. The memory may include a memory module that is mounted in a connector slot, which is manufactured on a motherboard. The memory controller and the memory module are electrically coupled through a transmission line formed on a printed circuit board (PCB). Therefore, signal attenuation on the transmission line may be increased as a distance increases between the memory controller and the memory module.

One technique for reducing the effects of signal reflection on the transmission line is to use a termination resistor coupled to a termination voltage, which is referred to as a termination.

In a DDR2 memory module, an on die termination (ODT) may be adopted such that the termination resistor installed in each DRAM chip of a module in a stand-by mode is activated, and the termination resistor of the module in an active mode is deactivated so that the termination resistor of the module in the stand-by mode may serve as the termination resistor of the module in the active mode. Using the on die termination technique, simpler interconnections on the motherboard may be achieved.

FIG. 1 is a circuit diagram illustrating a conventional push-pull data output buffer and FIG. 2 is a timing diagram illustrating an operation of the push-pull data output buffer of FIG. 1.

Referring to FIG. 1, a transmitter chip 100 outputs an internal data signal DATA to an output terminal 104 via the push-pull data output buffer 102. The output terminal 104 is coupled to a termination resistor RTT through a transmission line 106 and the termination resistor RTT is coupled to a supply voltage VDDQ.

A receiver chip 110 receives a signal at an input buffer 112 through the transmission line 106. The input signal is compared with a reference voltage VREF to determine whether a received signal is in a logic "high" state or logic "low" state.

When the transmitter chip 100 outputs a signal having the logic "high" state, the data signal DATA has a logic "low" state so that a pull-up transistor PUD of the output buffer 102 is turned on and a pull-down transistor PDD is turned off. Therefore, the output terminal 104 receives a power supply voltage VDDQ through the pull-up transistor PUD and also through the termination resistor RTT so that an output voltage DQ at the output terminal 104 is rapidly increased to a voltage level approximating about VDDQ.

When the transmitter chip 100 outputs a signal having the logic "low" state, the data signal DATA has a logic "high" state so that the pull-up transistor PUD is turned off and the pull-down transistor PDD is turned on. Therefore, the output terminal 104 receives a power supply voltage VSSQ through the pull-down transistor PDD so that an output voltage DQB at the output terminal 104 is decreased slower than a rising rate of the output voltage DQ to a voltage level VOL, which is expressed as the following equation 1.

$$V_{OL} = (VDDQ - VSSQ) \times RON_{PDD} / (RON_{PDD} + RTT + RTL) \quad \text{[Equation 1]}$$

Herein, $RON_{PDD}$ is the turn-on resistance of the pull-down transistor PDD and RTL is the resistance of the transmission line. Therefore, an intersection point of a rising transition of the output voltage DQB and a falling transition of the output voltage DQ is higher than the reference voltage VREF, which is depicted in area A in FIG. 2. Namely, a skew may be generated between the rising transition and the falling transition of the data output signal so that signal integrity is degraded.

To overcome the above problem, a conventional approach is used to delay an enable signal applied to the output buffer when data is driven high relative to when the data is driven low so that a rising transition and a falling transition of the enable signal may intersect at the reference voltage level VREF.

However, the conventional approach is based on controlled timing so that a predefined amount of delay may vary depending on variances in process, power supply voltage, temperature, etc. The change in the amount of delay caused by the variance of the respective parameters may affect a timing characteristic including tDQSQ (skew between output data signal and RDQS signal) of the memory.

In a high-speed synchronous semiconductor memory device, a data strobe signal DQS is used to reduce the skew of data. The DQS signal is output through a data strobe signal output buffer. The data strobe signal output buffer may include a push-pull circuit that is controlled by a tri-state of a high impedance state, a logic high state and a logic low state.

FIG. 3 is a timing diagram illustrating a conventional data strobe signal.

Referring to FIG. 3, the data strobe signal (or DQS signal) may be divided into a preamble (represented as section A in FIG. 3), a time interval of toggling the DQS signal based on the clock signal (represented as section B in FIG. 3) and a postamble (represented as section C in FIG. 3). Compared with the sections B and C, the data strobe signal in the section A has a lower voltage level because the data strobe signal is driven low for a longer time period. Therefore, a first rising transition of the DQS signal in the section A is delayed so that a pulse width W1 of a first pulse of the DQS signal may be shorter than another pulse width W2.

Therefore, in a memory controller that receives data in synchronization with the data strobe signal, the decrease in the pulse width of the data strobe signal may cause difficulty in ensuring secure receipt of the data (e.g., D0). Therefore, signal integrity of the data (e.g., D0) may be degraded.

SUMMARY OF THE INVENTION

Accordingly, the present invention is provided to substantially obviate one or more problems that arise due to the limitations and disadvantages of the conventional approaches discussed above.

Example embodiments of the present invention provide an output buffer having a pre-emphasis function to improve signal integrity.

Example embodiments of the present invention also provide a data strobe signal output buffer to improve signal integrity of a data strobe signal of a semiconductor memory device.

Example embodiments of the present invention also provide a semiconductor memory device, which includes an output buffer having a pre-emphasis function to improve signal integrity.

Example embodiments of the present invention also provide a method of outputting data of a semiconductor memory device.

Example embodiments of the present invention also provide a method of outputting a data strobe signal of a semiconductor memory device.

In one aspect, the present invention is directed to a data output buffer that includes an output terminal, a buffer and a pull-down driver. The output terminal is coupled to a first end of a transmission line, the transmission line being coupled to a pull-up termination resistor at a second end. The buffer pulls up the output terminal to a first power supply voltage and pulls down to a second power supply voltage based on an output data. The pull-down driver pre-emphasizes an initial stage of a pull-down driving operation of the output terminal based on the output data.

In one embodiment, the buffer may include a PMOS transistor having first and second current electrodes coupled between the first power supply voltage and the output terminal, and a control electrode coupled to the output data, the PMOS transistor having a junction that has a first width; and an NMOS transistor having first and second current electrodes coupled between the second power supply voltage and the output terminal, and a control electrode coupled to the output data, the NMOS transistor having a junction that has the first width.

In one embodiment, the pull-down driver may include: a leading edge detection circuit configured to generate a leading edge detection signal based on detection of a leading edge of an output data signal that pulls down the output terminal; and an NMOS transistor having first and second current electrodes coupled between the second power supply voltage and the output terminal, and a control electrode coupled to the leading edge detection signal, a junction of the NMOS transistor having a second width that is wider than the first width.

In one embodiment, the NMOS transistor may be an electrostatic discharge protection transistor.

In one embodiment, the leading edge detection signal has an active period that is effective in compensating for a pull-down delay of the output terminal by the pull-up termination resistor, to maintain consistency with the speed of the pull-up driving operation.

In another aspect, the present invention is directed to a data strobe signal output buffer that includes a data strobe signal output terminal, an output driver and a pre-emphasis unit. The output driver pulls up the data strobe signal output terminal to a first power supply voltage and pulls down the data strobe signal output terminal to a second power supply voltage in response to a data strobe up signal and a data strobe down signal. The pre-emphasis unit pre-emphasizes the data strobe signal output terminal during a preamble period of the data strobe signal.

In one embodiment, the pre-emphasis unit may pre-emphasize the data strobe signal output terminal during a second half clock cycle that corresponds to a preamble period of the data strobe signal.

In one embodiment, the pre-emphasis unit may include: a pre-emphasis control signal generating unit configured to generate a pre-emphasis control signal that is activated during a second half clock cycle that corresponds to a preamble period of the data strobe signal based on a preamble signal and a clock signal; and a pre-emphasis driver configured to pull up the data strobe signal output terminal based on the pre-emphasis control signal, the data strobe up signal and the data strobe down signal.

In one embodiment, the pre-emphasis driver may have a pull-up driving capability such that a voltage drop is decreased during a second half clock cycle that corresponds to a preamble period of the data strobe signal, the pull-up driving capability of the pre-emphasis driver being smaller than a pull-down driving capability of the output driver.

In another aspect, the present invention is directed to a semiconductor memory device that includes: a memory cell array; at least one output terminal coupled to a first end of a transmission line, the transmission line being coupled to a pull-up termination resistor exterior to a memory device at a second end; and at least one pre-emphasis data output buffer configured to pull up the at least one output terminal to a first power supply voltage and pull down the at least one output terminal to a second power supply voltage in response to a data read from the memory cell array and configured to pre-emphasize an early stage of a pull-down driving operation of the at least one output terminal.

In another aspect, the present invention is directed to a data output method of a semiconductor memory that includes: generating a leading edge detection signal based on detection of a data signal read from a memory cell array; pull-down driving a data output terminal based on the data signal in synchronization with a clock signal; and pre-emphasizing the data output terminal at an early stage of the pull-down driving of the data output terminal in response to the leading edge detection signal.

In another aspect, the present invention is directed to a semiconductor memory device that includes: a memory cell array; a data strobe signal generating unit; a first output terminal through which data are output; a second output terminal through which a data strobe signal is output; a data output buffer configured to drive data read from the memory cell array to the first output terminal; and a pre-emphasis data strobe signal output buffer configured to drive the data strobe signal generated by the data strobe signal generating unit to the second output terminal, the pre-emphasis data strobe signal output buffer pre-emphasizing a preamble period of the data strobe signal.

In another aspect, the present invention is directed to a method of outputting a data strobe signal of a semiconductor memory device that includes: generating a data strobe signal in synchronization with a data read operation of a memory cell array; generating a pre-emphasis control signal corresponding to a preamble period of the data strobe signal; driving a data strobe signal output terminal based on the data strobe signal in synchronization with a clock signal; and pre-emphasizing the data strobe signal output terminal during a preamble driving of the data strobe signal output terminal based on the pre-emphasis control signal.

In another aspect, the present invention is directed to a semiconductor memory device that includes a memory cell array; a data strobe signal generating unit configured to generate a data strobe signal in synchronization with the memory cell array; a first output terminal through which data are output; a second output terminal through which the data strobe signal is output; a data output buffer configured to pull up the first output terminal to a first power supply voltage and pull down the first output terminal to a second power supply voltage based on data read from the memory cell array, the data output buffer pre-emphasizing an initial stage of pull-down driving of at least one of the first and second output terminals; and a pre-emphasis data strobe signal output buffer configured to drive the data strobe signal to the second output terminal, the pre-emphasis data strobe signal output buffer pre-emphasizing a preamble period of the data strobe signal.

In another aspect, the present invention is directed to a method of outputting data of a semiconductor memory device that includes: generating a data strobe signal in synchronization with a data read operation of a memory cell array; generating a pre-emphasis control signal corresponding to a preamble period of the data strobe signal; driving a data strobe signal output terminal based on the data strobe signal in synchronization with a clock signal; pre-emphasizing the data strobe signal output terminal during a preamble driving of the data strobe signal output terminal based on the pre-emphasis control signal; generating a leading edge detection signal based on detection of a data signal read from the memory cell array; pull-down driving a data output terminal based on the data signal in synchronization with the clock signal; and pre-emphasizing the data output terminal based on the leading edge detection signal at an initial stage of a pull-down driving of the output terminal.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 11 is a waveform diagram illustrating signals of respective relevant portions of FIG. 9 and FIG. 10.

DETAILED DESCRIPTION OF EMBODIMENTS OF THE INVENTION

Hereinafter, the present invention will be explained in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
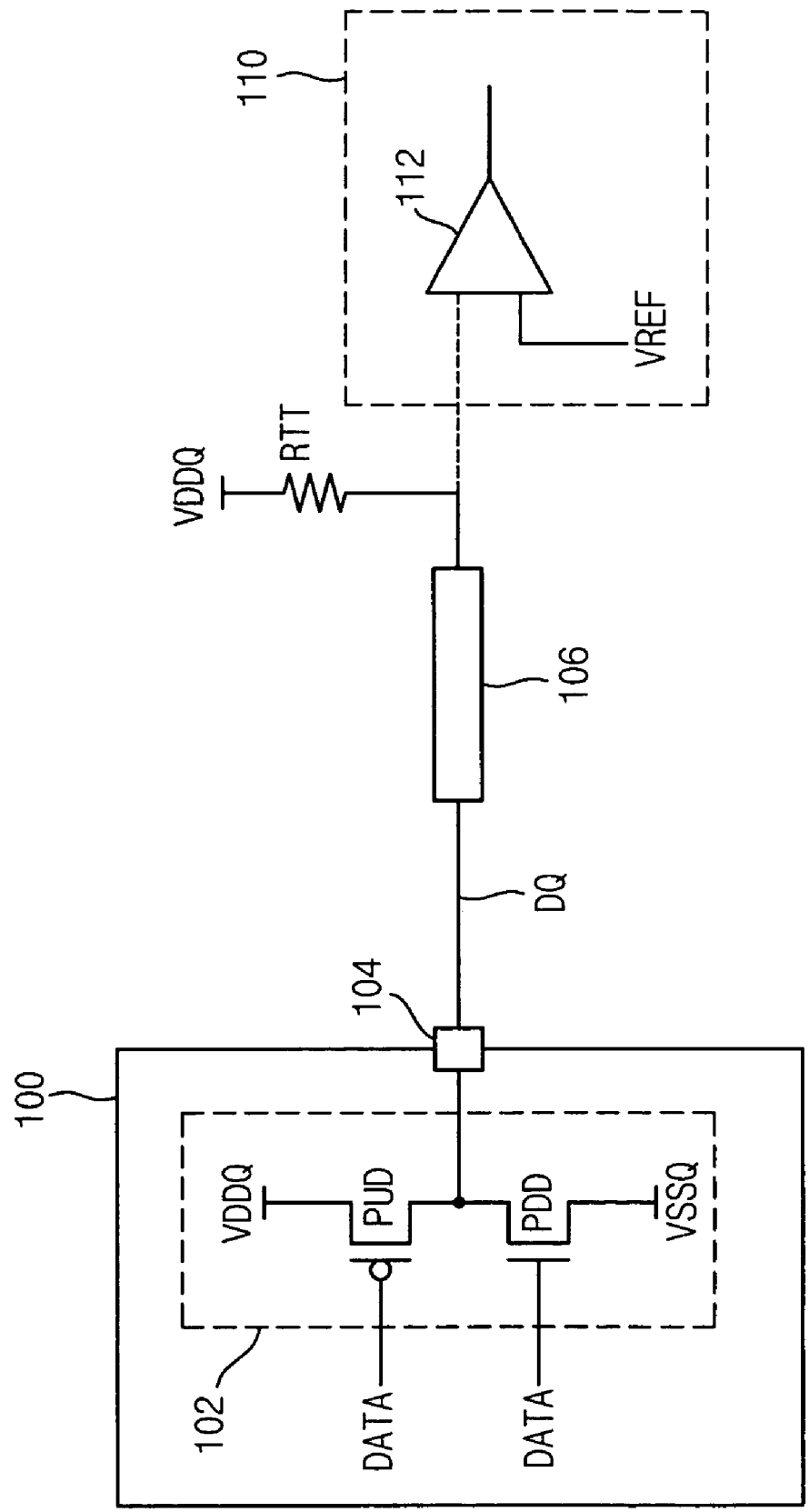
FIG. 1 is a circuit diagram illustrating a conventional push-pull data output buffer.
Figure 2:
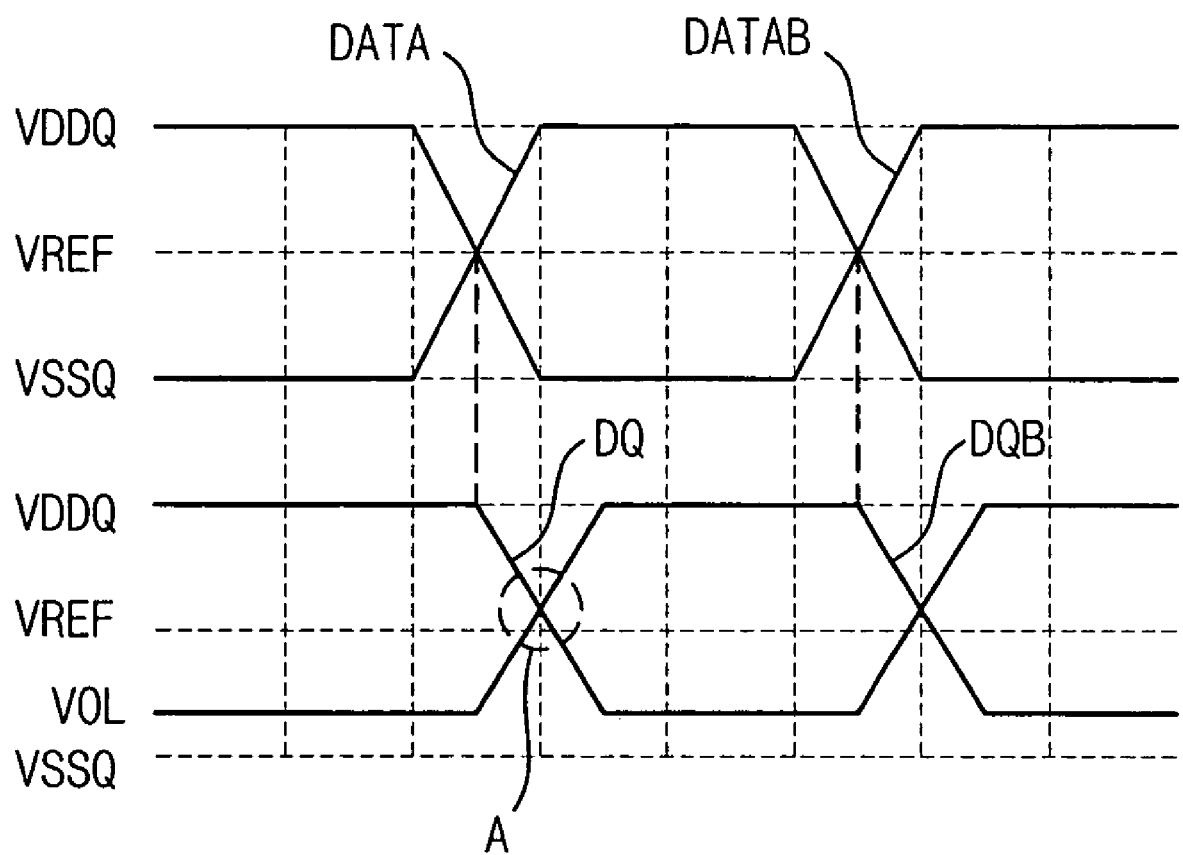
FIG. 2 is a timing diagram illustrating the operation of the push-pull data output buffer of FIG. 1.
Figure 3:
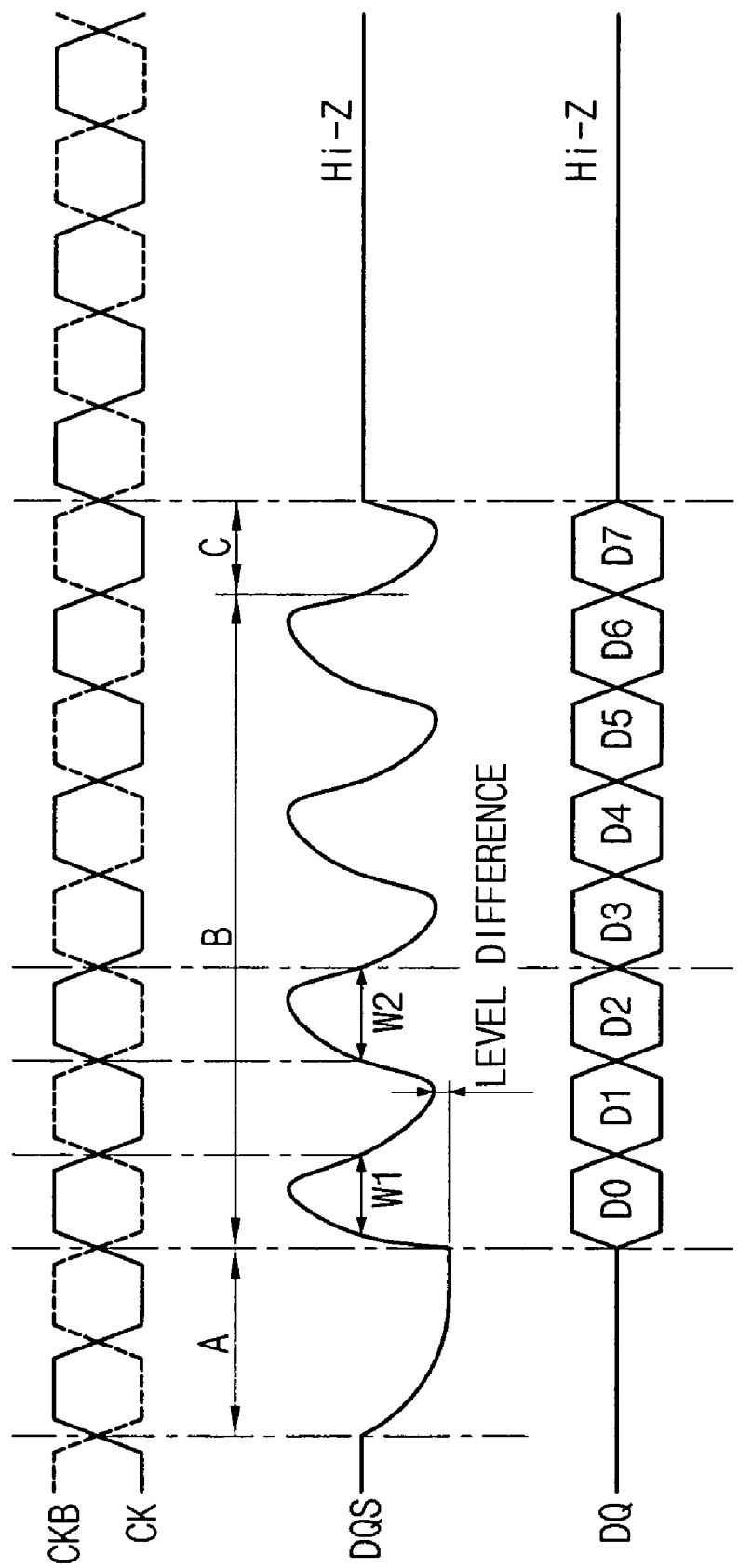
FIG. 3 is a timing diagram illustrating a conventional data strobe signal.
Figure 4:
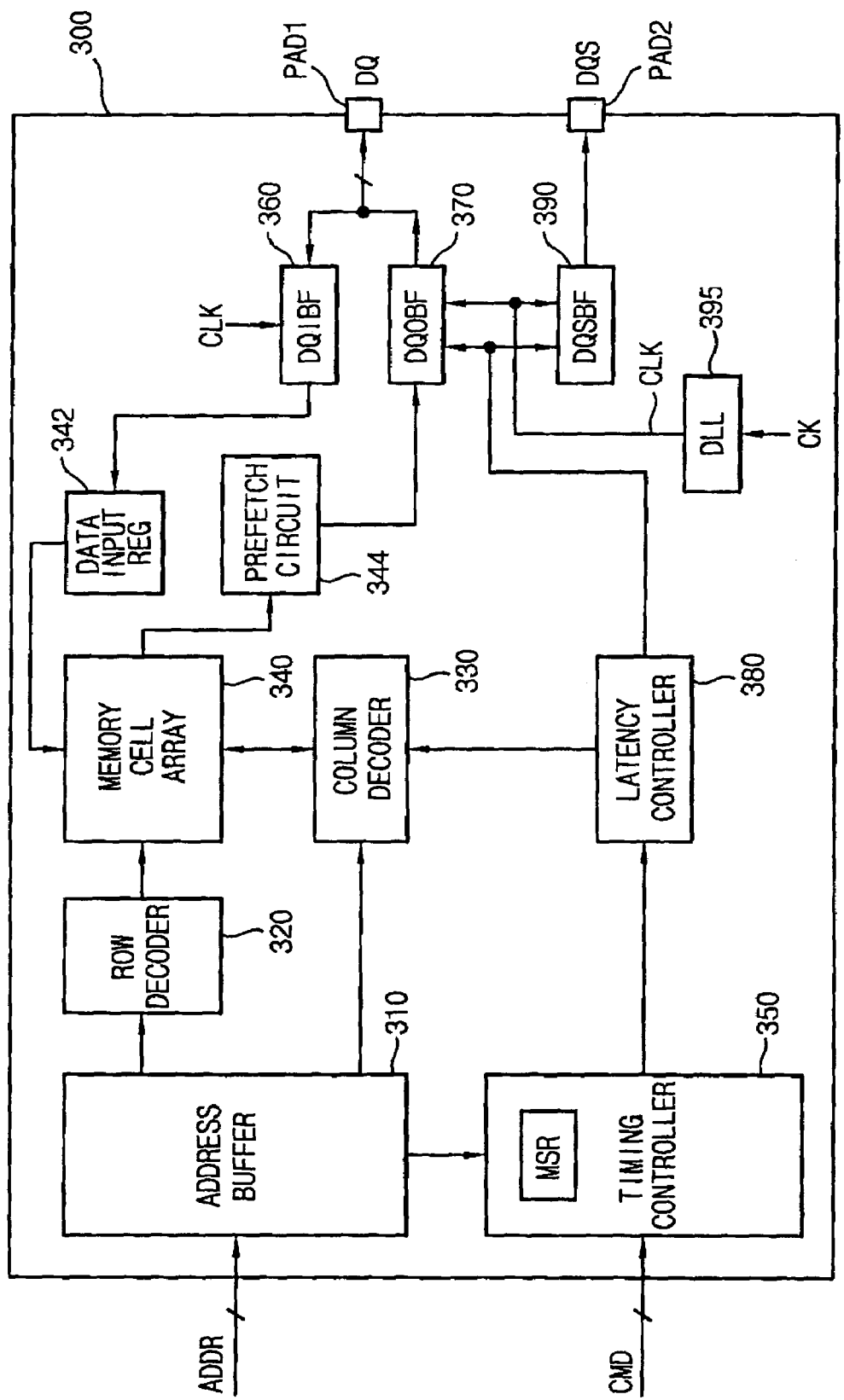
FIG. 4 is a block diagram illustrating a memory device having a pre-emphasis output buffer according to an example embodiment of the present invention.

FIG. 4 is a block diagram illustrating a memory device having a pre-emphasis output buffer according to an example embodiment of the present invention.

The semiconductor memory device 300 in FIG. 4 may correspond to a synchronous graphics double data rate (GDDR) SDRAM. The semiconductor memory device 300 may include an address buffer 310, a row decoder 320, a column decoder 330, a memory cell array 340, a timing controller 350, an input buffer 360, an output buffer 370, a latency controller 380, a data strobe signal output buffer 390 and a delay-locked loop (DLL) 395.

The address buffer 310 buffers an external address signal ADDR in synchronization with a clock signal CK and provides a buffered address signal to a row decoder 320 and a column decoder 330. In addition, the address buffer 310 provides a mode set register MSR of the timing controller 350 with the address signal including mode set information.

The input buffer DQIBF 360 buffers input data DQ input through an input and output terminal PAD1 in response to an internal clock signal CLK and provides buffered input data to the memory cell array 340. The input buffer 360 may include a data input register 342 placed between the input buffer 360 and the memory cell array 340. The data input register 342 operates in response to an input/output control signal that is generated based on a write enable signal and a data masking signal.

The output buffer (or pre-emphasis data output buffer) DQOBF 370 having a pre-emphasis function receives data read from the memory cell array 340 and outputs the data to the input and output pad PAD1 in response to the internal clock signal CLK and an output control signal. The output buffer (or pre-emphasis data output buffer) 370 may include a pre-fetch circuit 344 placed between the output buffer 370 and the memory cell array 340.

The latency controller 380 receives latency information set in the MSR of the timing controller 350, a signal having burst length information, a read command signal, etc., to generate a latency control signal. The latency control signal is provided to the column decoder 330, the output buffer 370 and the data strobe signal output buffer 390.

The data strobe signal output buffer DQSBF 390 outputs a data strobe signal DQS that is pre-emphasized in response to the latency control signal and the internal clock signal CLK to a data strobe signal output terminal PAD2.

The DLL 395 generates the internal clock signal CLK based on an external clock signal CK.

The timing controller 350 decodes commands based on the clock signal CK, a clock enable signal CKE, a chip select signal CS, a row strobe signal RAS, a column strobe signal CAS, a write enable signal WE, etc., and generates internal control signals for performing the decoded commands. The timing controller 350 includes the mode set register MSR that is a programming register to store the mode set information included in the address signal and generates an associated mode set signal.

Therefore, in a data read operation, the semiconductor memory device may generate the data strobe signal based on given column latency information, for example, CL=2, 3, 4, 5, 6, 7, . . . , and burst length information, for example, BL=2, 4, 8, 16, . . . . A pre-emphasis control signal corresponding to a preamble period of the data strobe signal is generated and the data strobe signal output terminal PAD2 is driven by the data strobe signal in synchronization with the clock signal. Based on the pre-emphasis control signal, the data strobe signal output terminal PAD2 is pre-emphasized when driving the preamble of the data strobe signal output terminal PAD2.

The pre-emphasis data output buffer 370 may generate a leading edge detection signal based upon detection of a leading edge of the data signal read from the memory cell array 340. When pull-down driving the data output terminal PAD1 by the data signal synchronized with the clock signal CLK, the pre-emphasis data output buffer 370 pre-emphasizes the data output terminal PAD1 based on the leading edge detection signal at an early stage of the pull-down driving of the data output terminal PAD1.

Details of the pre-emphasis data output buffer 370 and the pre-emphasis data store signal output buffer 390 will be described below.

Figure 5:
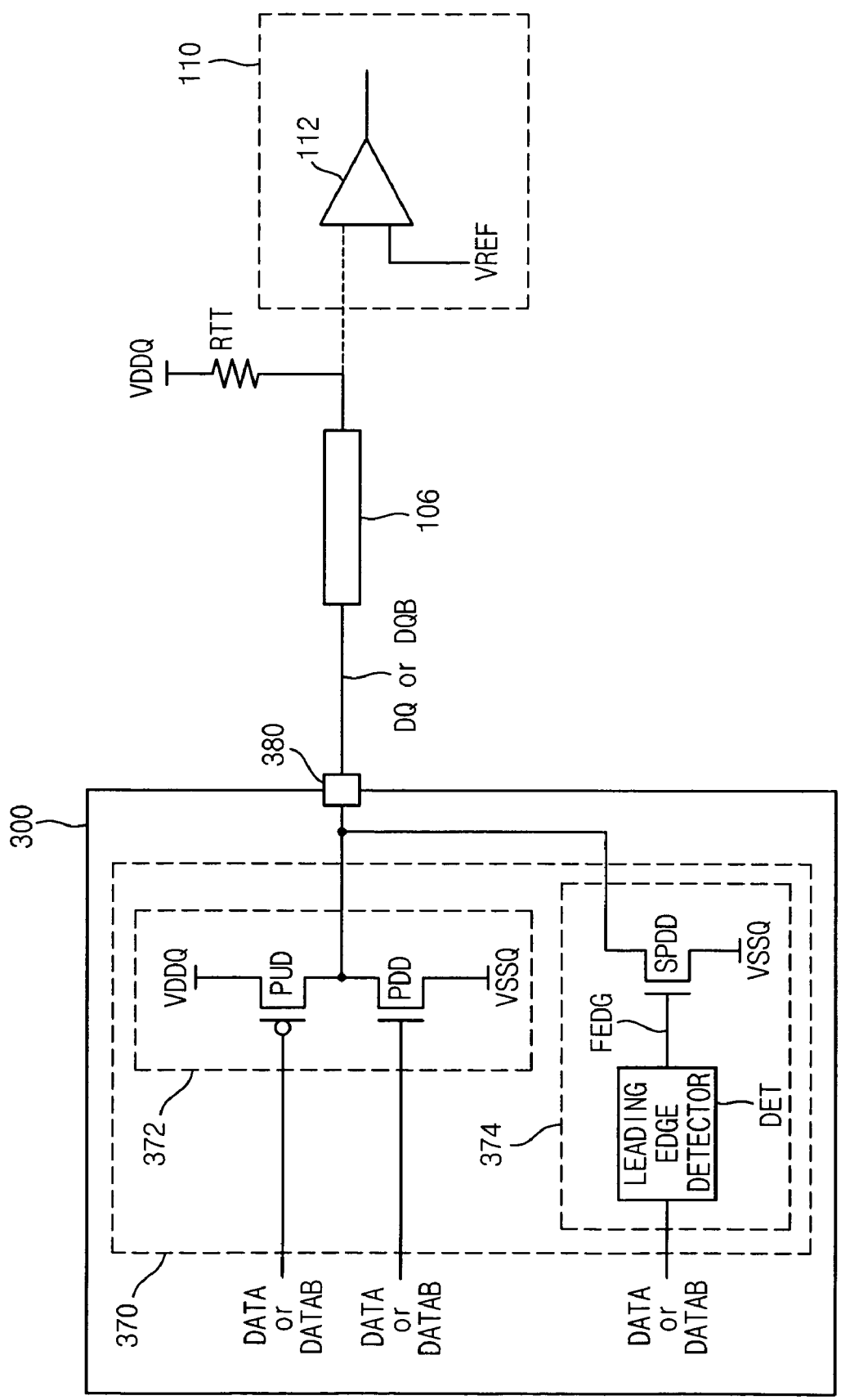
FIG. 5 is a circuit diagram illustrating the pre-emphasis output buffer of FIG. 4.

FIG. 5 is a circuit diagram illustrating the pre-emphasis data output buffer 370 of FIG. 4. Only the pre-emphasis data output buffer 370 of the semiconductor memory device 300 shown in FIG. 5 is illustrated, and the remaining portions are omitted for the sake of clarity.

Referring to FIG. 5, the pre-emphasis data output buffer 370 includes a buffer 372 and a pull-down driver 374. The buffer 372 includes a pull-up transistor PUD and a pull-down transistor PDD. The pull-up transistor PUD has a source electrode coupled to a power supply voltage VDDQ, a drain electrode coupled to an output terminal 380 and a gate electrode for receiving a data signal DATA. The pull-down transistor PDD has a source electrode coupled to ground VSSQ, a drain electrode coupled to the output terminal 380 and a gate electrode for receiving the data signal DATA.

The pull-down driver 374 includes a sub-pull-down transistor SPDD and a leading edge detector DET. The sub-pull-down transistor SPDD has a drain electrode coupled to the output terminal 380, a source electrode coupled to the ground VSSQ and a gate electrode coupled to a leading edge detection signal FEDG.

The sub-pull-down transistor SPDD has a channel width wider than that of the pull-up transistor PUD and the pull-down transistor PDD. For example, the sub-pull-down transistor SPDD may have a relatively large transistor size corresponding to a transistor size of an electrostatic discharge protection transistor so as to prevent an increase of input capacitance. Thus, a desired timing characteristic of tDQSQ may be achieved.

Figure 6:
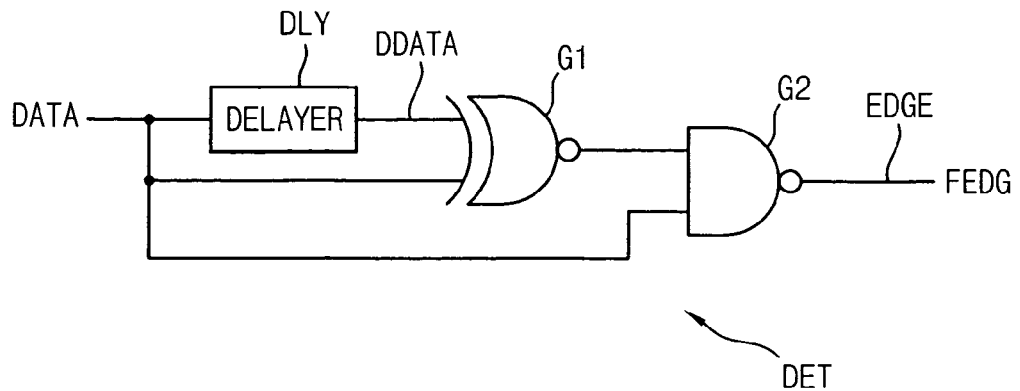
FIG. 6 is a circuit diagram illustrating a leading edge detector of FIG. 5.

FIG. 6 is a circuit diagram illustrating the leading edge detector DET of FIG. 5.

Referring to FIG. 6, the leading edge detector DET includes a delayer DLY for delaying the data signal DATA by a predetermined time period, an XNOR gate G1 and a NAND gate G2.

The XNOR gate G1 receives the data signal DATA and a delayed data signal DDATA output from the delayer DLY, and detects a rising edge and a falling edge of the data signal DATA by detecting a period where the delayed data signal DDATA corresponds to the data signal DATA to generate an edge detection signal EDGE.

The NAND gate G2 passes a leading edge of the edge detection signal EDGE and holds a trailing edge of the edge detection signal EDGE based on a logical combination of the data signal DATA and the edge detection signal EDGE to generate a leading edge detection signal FEDG.

Figure 7:
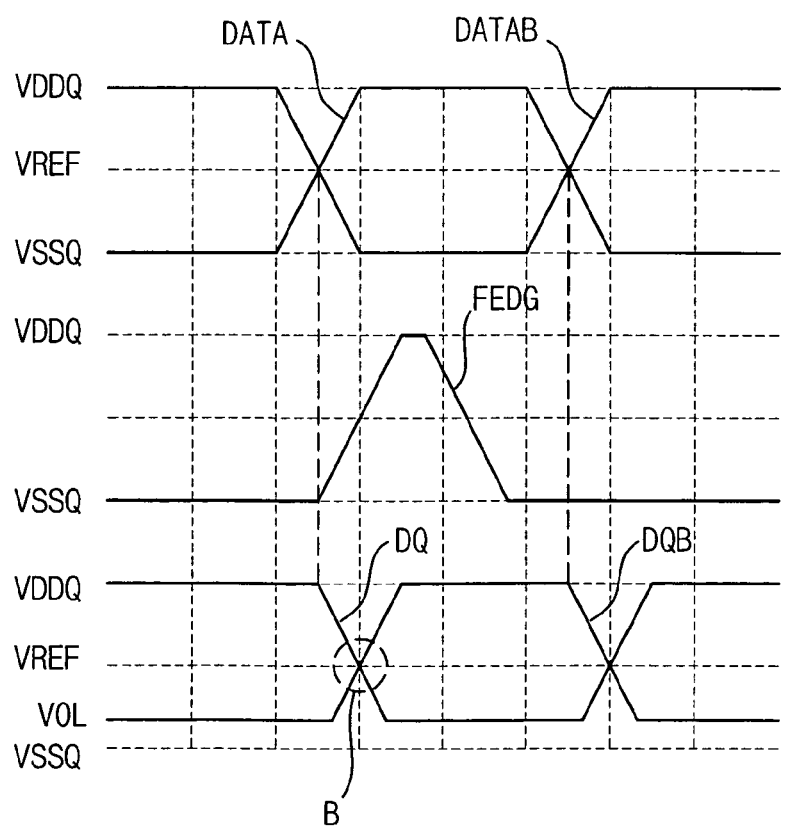
FIG. 7 is a timing diagram illustrating an operation of the pre-emphasis output buffer of FIG. 5.

FIG. 7 is a timing diagram illustrating an operation of the pre-emphasis data output buffer of FIG. 5.

Referring to FIGS. 5 and 7, the data signal DATA or DATAB is applied to both the output buffer 370 and the leading edge detector DET. The leading edge detector DET generates the leading edge detection signal FEDG in response to the rising edge of the data signal DATA. The leading edge detection signal FEDG is applied to the gate terminal of the sub-pull-down transistor SPDD to turn on the sub-pull-down transistor SPDD. The pull-down transistor PDD is also turned on in response to the rising edge of the data signal DATA and the pull-up transistor PUD is turned off. Therefore, a voltage level of the output terminal 380 is decreased from VDDQ.

When the leading edge detection signal FEDG has an active state, both the pull-down transistor PDD and the sub-pull-down transistor SPDD are turned on so that a voltage potential at the output terminal is quickly decreased.

When the leading edge detection signal FEDG has a non-active state, the sub-pull-down transistor SPDD is turned off so that the output terminal 380 is driven by the pull-down transistor PDD to have a voltage level that is decreased to about a voltage level VOL described with respect to the related art and represented as Equation 1.

Thus, according to an example embodiment of the present invention, the pull-down driving capability is increased using two pull-down transistors PDD and SPDD in response to the rising edge of the data signal DATA so that the voltage level of an output signal DQ or DQB may be quickly decreased to a voltage level of a reference voltage VREF. Therefore, as shown in area B in FIG. 7, a rising transition and a falling transition of the output signal DQ and DQB intersect at a voltage level of the reference voltage VREF so that a skew does not occur.

Figure 8A:
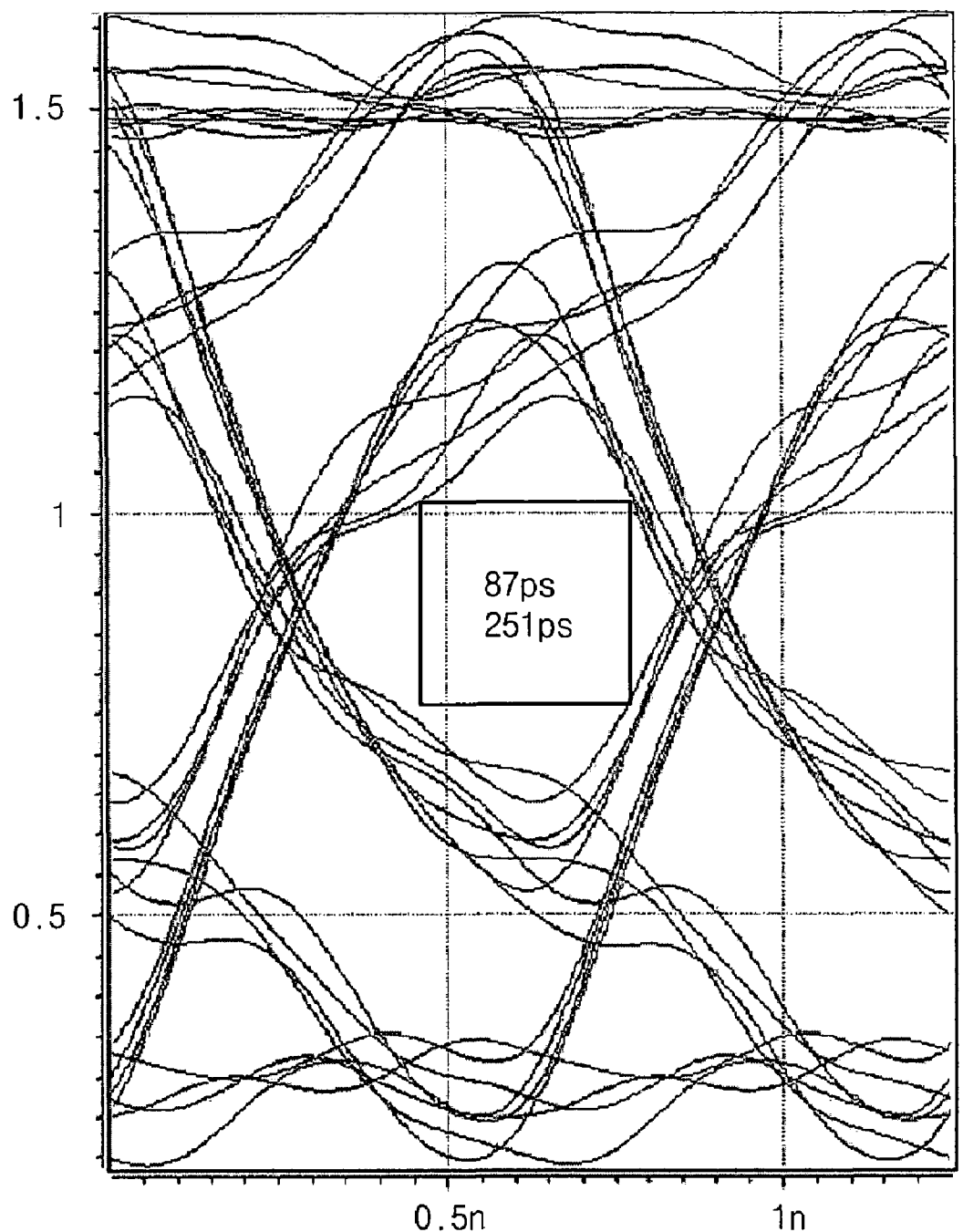
FIG. 8A is a simulated eye diagram of a pre-emphasis output buffer of FIG. 7.
Figure 8B:
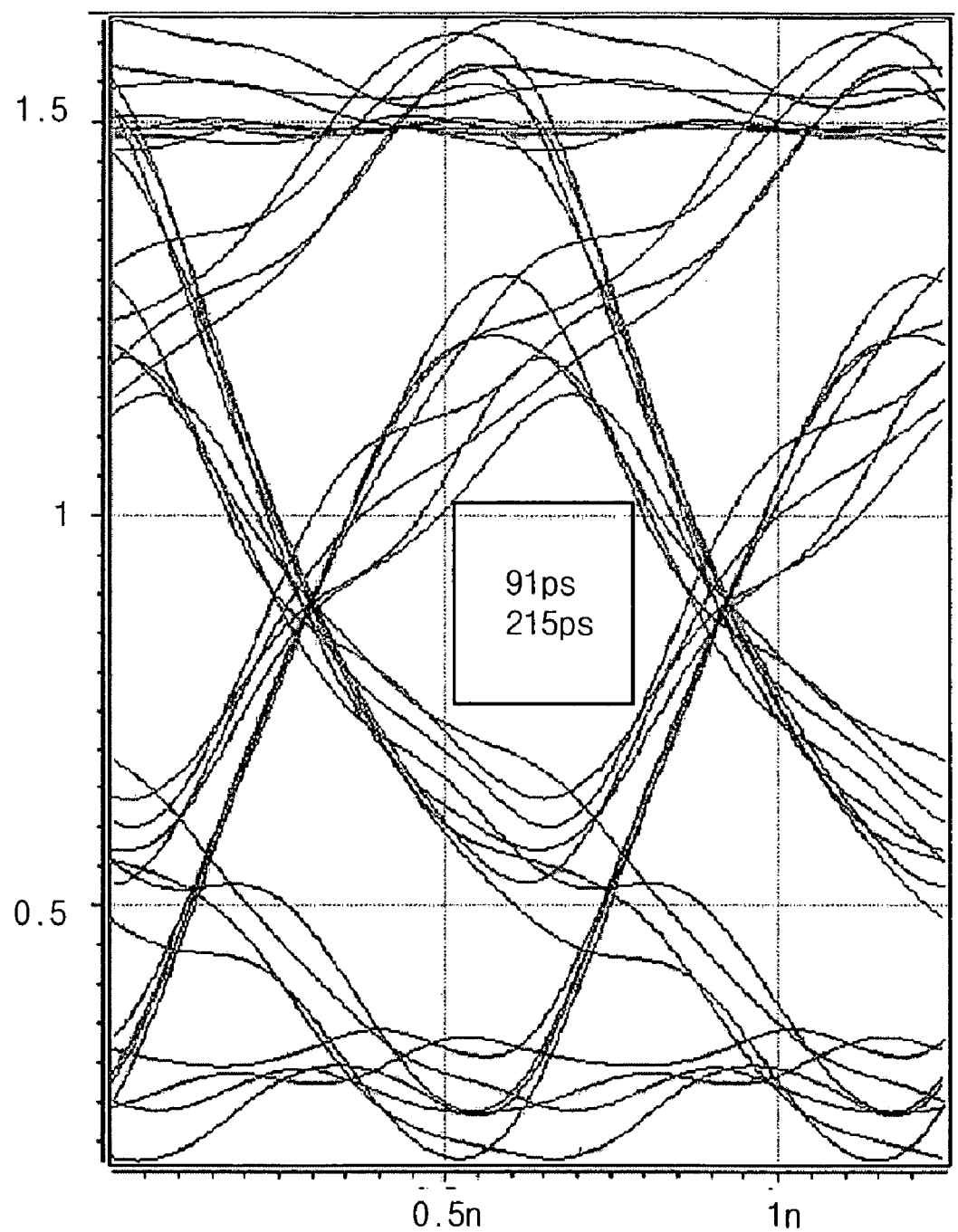
FIG. 8B is a simulated eye diagram for a conventional output buffer.

FIGS. 8A and 8B are simulated eye diagrams comparing an eye pattern of a pre-emphasis data output buffer according to an example embodiment of the present invention and an eye pattern of the prior art output buffer.

In FIGS. 8A and 8B, the x-axis corresponds to a voltage level and the y-axis corresponds to an operating timing. It can be seen that the pre-emphasis data output buffer has an eye of about 251 picoseconds (ps), which is wider than the eye of about 215 picoseconds of the conventional output buffer by about 36 picoseconds. Therefore, signal integrity is improved.

With regard to the pre-emphasis data strobe output buffer, pre-emphasis may be set in advance because the data strobe signal has a regular waveform compared with the data signal. Therefore, the pre-emphasis data strobe output buffer may be implemented in a configuration that is different from that of the pre-emphasis data output buffer.

Figure 9:
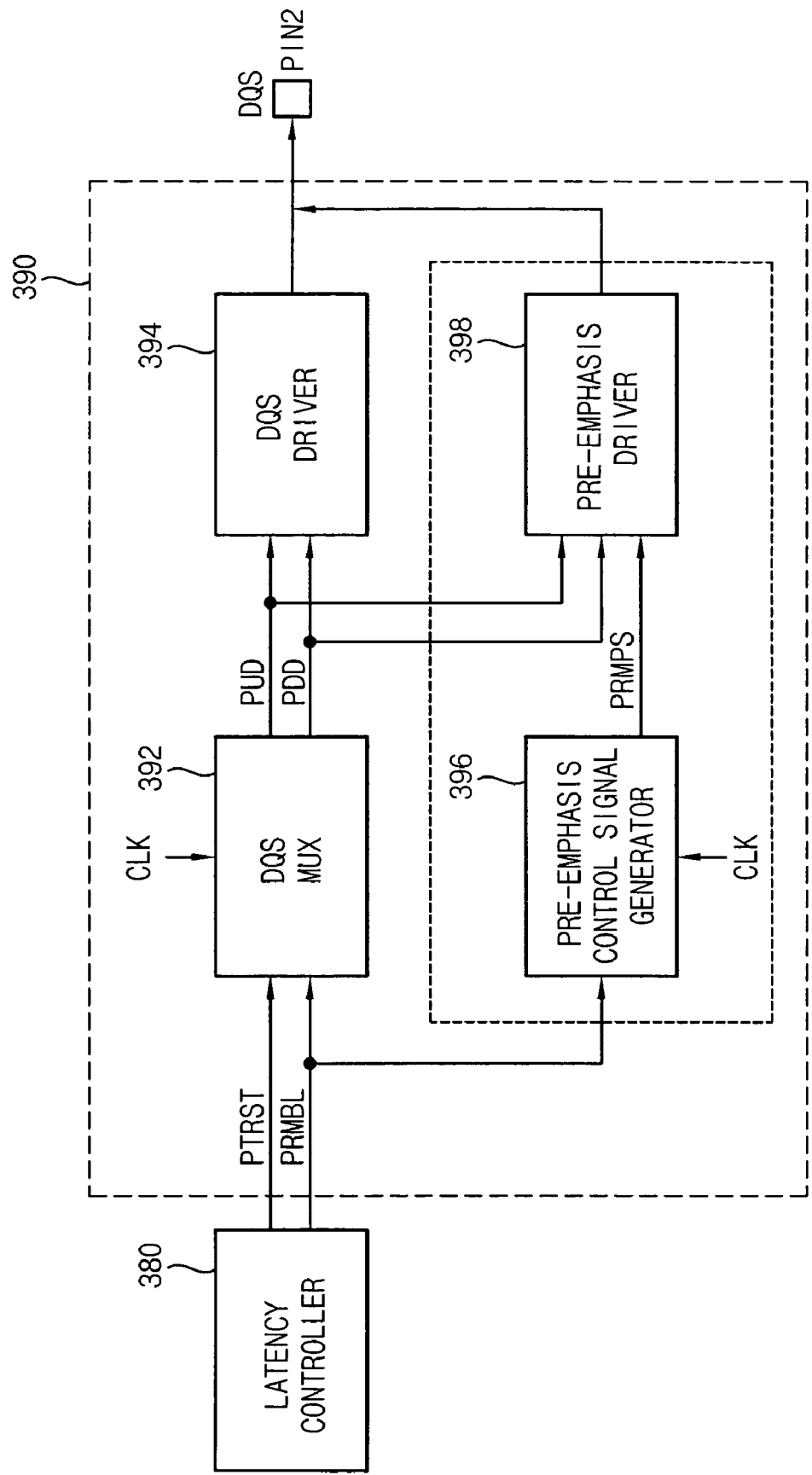
FIG. 9 is a block diagram illustrating a data strobe output buffer with pre-emphasis function according to an example embodiment of the present invention.
Figure 10:
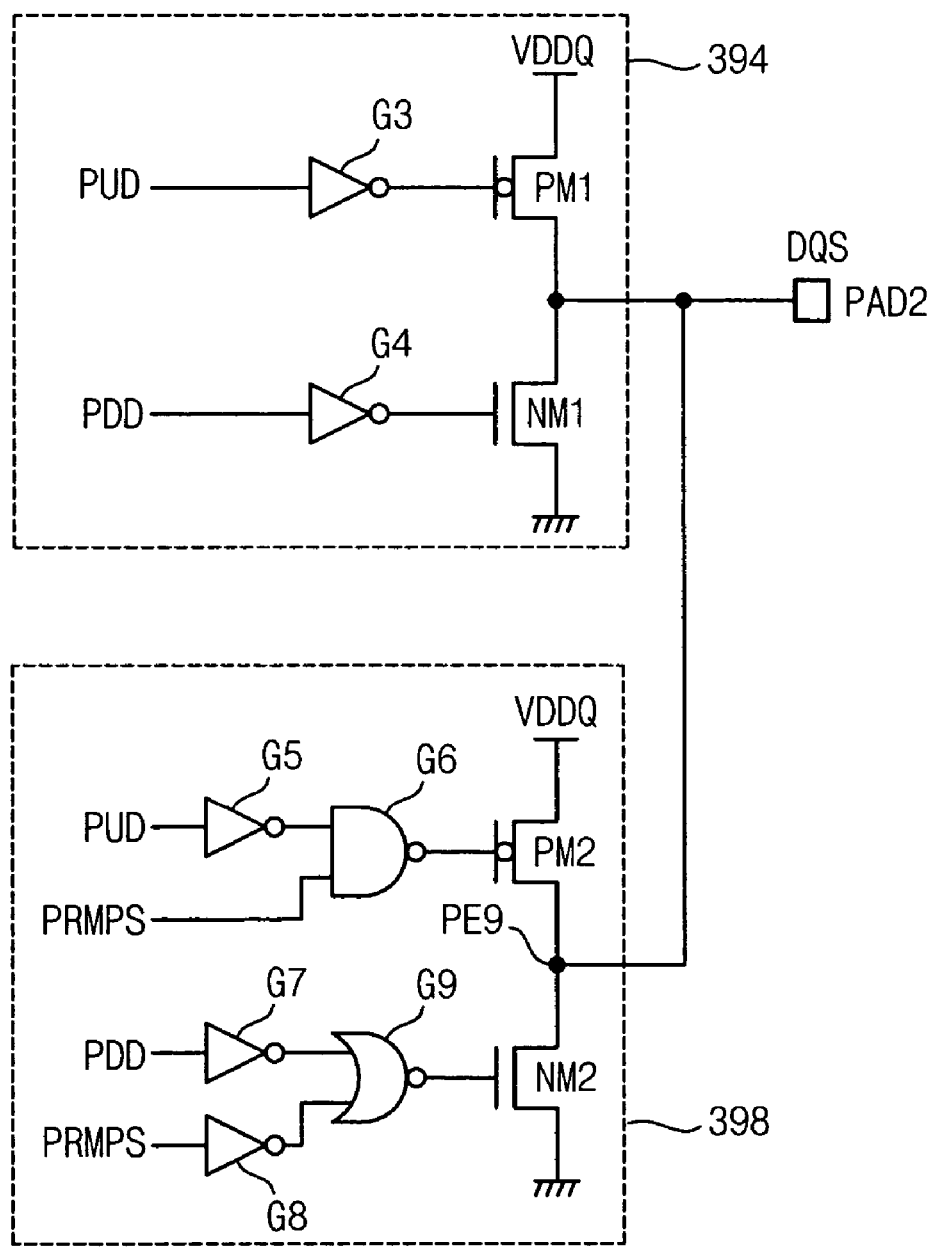
FIG. 10 is a circuit diagram illustrating the respective drivers of FIG. 9.

FIG. 9 is a block diagram illustrating a data strobe signal output buffer 390 with a pre-emphasis function according to an example embodiment of the present invention, FIG. 10 is a circuit diagram illustrating the DQS driver 394 and the pre-emphasis driver 398 of FIG. 9 and FIG. 11 is a waveform diagram illustrating signals of respective relevant portions of FIG. 9 and FIG. 10.

Referring to FIGS. 9, 10 and 11, the data strobe signal output buffer DQSBF 390 includes a DQS multiplexer 392, a DQS driver 394, a pre-emphasis control signal generator 396 and a pre-emphasis driver 398.

The DQS multiplexer 392 generates a pull-up drive signal PUD and a pull-down drive signal PDD based on a tri-state control signal PTRST and a preamble signal PRMBL provided from the latency controller 380 and the internal clock signal CLK. The tri-state control signal PRTST maintains a logic high state while the data strobe signal DQS is activated and otherwise, maintains a logic low state as shown in FIG. 11. The preamble signal PRMBL maintains a logic high state during one clock cycle of the internal clock signal CLK and maintains a logic low state during the remaining periods. Therefore, the pull-up drive signal PUD has phases that are the same as the internal clock signal CLK for four clock cycles, and maintains a logic low state during the remaining periods. The PDD signal is generated by summing the preamble signal PRMBL and the internal clock signal CLK for 4.5 clock cycles, and the PDD signal maintains a logic low state during the remaining periods.

The DQS driver 394 includes inverters G3 and G4, the pull-up transistor PM1 and the pull-down transistor NM1. The DQS driver 394 outputs the data strobe signal DQS to the output terminal PAD2 in response to the pull-up drive signal PUD and the pull-down drive signal PDD.

The pre-emphasis control signal generator 396 generates a pre-emphasis control signal PRMPS based on the preamble signal PRMBL and the internal clock signal CLK. As shown in FIG. 11, the pre-emphasis control signal PRMPS has a logic high state for only a half of the clock cycle corresponding to the preamble period (i.e., the preamble signal PRMBL has a logic high state) and maintains a logic low state during the remaining periods.

The pre-emphasis driver 398 includes inverters G5, G7 and G8, a NAND gate G6, a NOR gate G9, a pull-up transistor PM2 and a pull-down transistor NM2. It is desirable that the pull-up transistor PM2 and the pull-down transistor NM2 each have a size that is (width to length ratio) relatively smaller than the size of the transistors PM1 and NM1 of the DQS driver 394, to decrease a voltage drop according to a difference in driving period (i.e., 0.5 clock cycles).

The pull-up transistor PM2 is turned on when the pre-emphasis control signal PRMPS has a logic high state. The pull-down transistor NM2 remains turned off. Therefore, the pre-emphasis driver 398 is pull-up driven only when the pre-emphasis control signal PRMPS has a logic high state, so that the data strobe signal DQS is pre-emphasized during a second half clock cycle of the preamble period of the data strobe signal DQS and accordingly, the voltage level of the data strobe signal DQS in a logic low state is slightly increased.

Therefore, as shown in FIG. 11, a logic low level (represented as in a solid line) of the data strobe signal DQS is pre-emphasized during a second half clock cycle of the preamble period so that a first rising transition of the data strobe signal DQS occurs more quickly as compared to that of the conventional approach (represented as a dotted line). Namely, the first rising transition can occur in conditions that are substantially the same as other successive rising edges. Therefore, signal integrity is improved.

As described above, the pull-down driving capability of a push-pull type output buffer, which drives a transmission line coupled to a VDDQ termination resistance, is increased to speed up a falling transition of an output signal, thereby eliminating skew between a rising transition and a falling transition thereof.

In addition, by pre-emphasizing the preamble period of the data strobe signal (DQS signal), the data strobe signal has a quick rising edge transition as compared to that of the conventional approach, so that signal integrity is thereby improved.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A data output buffer, comprising:
   an output terminal coupled to a first end of a transmission line, the transmission line being coupled to a pull-up termination resistor at a second end;
   a buffer configured to pull up the output terminal to a first power supply voltage and configured to pull down the output terminal to a second power supply voltage based on an output data signal; and
   a pull-down driver configured to pre-emphasize an initial stage of a pull-down driving operation of the output terminal based on the output data signal, wherein the output data signal applied to the buffer and the output data signal applied to the pull-down driver are the same signal and have the same signal value.

2. The data output buffer of claim 1, wherein the buffer includes:
   a PMOS transistor having first and second current electrodes coupled between the first power supply voltage and the output terminal and a control electrode coupled to the output data signal, the PMOS transistor having a junction of a first width; and
   an NMOS transistor having first and second current electrodes coupled between the second power supply voltage and the output terminal and a control electrode coupled to the output data signal, the NMOS transistor having a junction of the first width.

3. The data output buffer of claim 1, wherein the pull-down driver includes:
   a leading edge detection circuit configured to generate a leading edge detection signal in response to a leading edge of the output data signal; and
   an NMOS transistor having first and second current electrodes coupled between the second power supply voltage and the output terminal and a control electrode coupled to the leading edge detection signal, a junction of the NMOS transistor having a second width that is wider than the first width.

4. The data output buffer of claim 3, wherein the NMOS transistor is an electrostatic discharge protection transistor.

5. The data output buffer of claim 3, wherein the leading edge detection signal has an active period that is effective in compensating for a pull-down delay of the output terminal by the pull-up termination resistor.

6. A data strobe signal output buffer, comprising:
   a data strobe signal output terminal;
   an output driver configured to pull up the data strobe signal output terminal to a first power supply voltage and configured to pull down the data strobe signal output terminal to a second power supply voltage based on a data strobe up signal and a data strobe down signal, wherein the output driver outputs a data strobe signal to the data strobe signal output terminal; and
   a pre-emphasis unit configured to pre-emphasize the data strobe signal output terminal during a preamble period of the data strobe signal, wherein, during the preamble period, a voltage level of the data strobe signal is increased so that a first rising transition of the data strobe signal is substantially the same as a subsequent second rising transition of the data strobe signal.

7. The data strobe signal output buffer of claim 6, wherein the pre-emphasis unit pre-emphasizes the data strobe signal output terminal during a second half clock cycle that corresponds to a preamble period of the data strobe signal.

8. The data strobe signal output buffer of claim 6, wherein the pre-emphasis unit includes:
   a pre-emphasis control signal generating unit configured to generate a pre-emphasis control signal that is activated during a second half clock cycle that corresponds to a preamble period of the data strobe signal based on a preamble signal and a clock signal; and
   a pre-emphasis driver configured to pull up the data strobe signal output terminal based on the pre-emphasis control signal, the data strobe up signal and the data strobe down signal.

9. The data strobe signal output buffer of claim 6, wherein the pre-emphasis driver has a pull-up driving capability such that a voltage drop is decreased during a second half clock cycle that corresponds to a preamble period of the data strobe signal, the pull-up driving capability of the pre-emphasis driver being smaller than a pull-down driving capability of the output driver.

10. A semiconductor memory device comprising:
    a memory cell array;
    at least one output terminal coupled to a first end of a transmission line, the transmission line being coupled to a pull-up termination resistor exterior to a memory device at a second end; and
    at least one pre-emphasis data output buffer configured to pull up the at least one output terminal to a first power supply voltage and configured to pull down the at least one output terminal to a second power supply voltage in response to a data read from the memory cell array, and configured to pre-emphasize an early stage of a pull-down driving operation of the at least one output terminal.

11. A data output method of a semiconductor memory, comprising:
    generating a leading edge detection signal in response to a leading edge of a data signal read from a memory cell array;
    pulling-down a data output terminal based on the data signal in synchronization with a clock signal; and
    pre-emphasizing the data output terminal at an early stage of the pull-down operation of the data output terminal in response to the leading edge detection signal.

12. A semiconductor memory device comprising:
    a memory cell array;
    a data strobe signal generating unit;
    a first output terminal through which data are output;
    a second output terminal through which a data strobe signal is output;
    a data output buffer configured to drive data read from the memory cell array to the first output terminal; and
    a pre-emphasis data strobe signal output buffer configured to drive the data strobe signal generated by the data strobe signal generating unit to the second output terminal, the pre-emphasis data strobe signal output buffer pre-emphasizing a preamble period of the data strobe signal.

13. A method of outputting a data strobe signal of a semiconductor memory device, comprising:
    generating a data strobe signal in synchronization with a data read operation of a memory cell array;
    generating a pre-emphasis control signal corresponding to a preamble period of the data strobe signal;
    driving a data strobe signal output terminal based on the data strobe signal in synchronization with a clock signal; and
    pre-emphasizing the data strobe signal output terminal while a preamble of the data strobe signal output terminal is driven based on the pre-emphasis control signal.

14. A semiconductor memory device comprising:
    a memory cell array;
    a data strobe signal generating unit configured to generate a data strobe signal in synchronization with a read operation of the memory cell array;
    a first output terminal through which data are output;
    a second output terminal through which the data strobe signal is output;
    a data output buffer configured to pull up the first output terminal to a first power supply voltage and configured to pull down the first output terminal to a second power supply voltage based on data read from the memory cell array, the data output buffer pre-emphasizing an initial stage of pull-down driving of at least one of the first and second output terminals; and
    a pre-emphasis data strobe signal output buffer configured to drive the data strobe signal to the second output terminal, the pre-emphasis data strobe signal output buffer pre-emphasizing a preamble period of the data strobe signal.

15. A method of outputting data of a semiconductor memory device, comprising:
    generating a data strobe signal in synchronization with a data read operation of a memory cell array;
    generating a pre-emphasis control signal corresponding to a preamble period of the data strobe signal;
    driving a data strobe signal output terminal based on the data strobe signal in synchronization with a clock signal;
    pre-emphasizing the data strobe signal output terminal during a preamble driving of the data strobe signal output terminal based on the pre-emphasis control signal;
    generating a leading edge detection signal in response to a leading edge of a data signal read from the memory cell array;
    pull-down driving a data output terminal based on the data signal in synchronization with the clock signal; and
    pre-emphasizing the data output terminal based on the leading edge detection signal at an initial stage of a pull-down driving of the output terminal.

16. A data output buffer, comprising:
    an output terminal coupled to a first end of a transmission line, the transmission line being coupled to a pull-up termination resistor at a second end;
    a buffer configured to pull up the output terminal to a first power supply voltage and configured to pull down the output terminal to a second power supply voltage based on an output data signal, wherein the buffer includes:
    a PMOS transistor having first and second current electrodes coupled between the first power supply voltage and the output terminal and a control electrode coupled to the output data signal, the PMOS transistor having a junction of a first width; and
    an NMOS transistor having first and second current electrodes coupled between the second power supply voltage and the output terminal and a control electrode coupled to the output data signal, the NMOS transistor having a junction of the first width; and a pull-down driver configured to pre-emphasize an initial stage of a pull-down driving operation of the output terminal based on the output data signal.

17. A data output buffer, comprising:

an output terminal coupled to a first end of a transmission line, the transmission line being coupled to a pull-up termination resistor at a second end;

a buffer configured to pull up the output terminal to a first power supply voltage and configured to pull down the output terminal to a second power supply voltage based on an output data signal; and a pull-down driver configured to pre-emphasize an initial stage of a pull-down driving operation of the output terminal based on the output data signal, wherein the pull-down driver includes:

a leading edge detection circuit configured to generate a leading edge detection signal in response to a leading edge of the output data signal; and an NMOS transistor having first and second current electrodes coupled between the second power supply voltage and the output terminal and a control electrode coupled to the leading edge detection signal, a junction of the NMOS transistor having a second width that is wider than the first width.

18. The data output buffer of claim 17, wherein the NMOS transistor is an electrostatic discharge protection transistor.

19. The data output buffer of claim 17, wherein the leading edge detection signal has an active period that is effective in compensating for a pull-down delay of the output terminal by the pull-up termination resistor.

20. A data strobe signal output buffer, comprising:

a data strobe signal output terminal;

an output driver configured to pull up the data strobe signal output terminal to a first power supply voltage and configured to pull down the data strobe signal output terminal to a second power supply voltage based on a data strobe up signal and a data strobe down signal; and a pre-emphasis unit configured to pre-emphasize the data strobe signal output terminal during a preamble period of the data strobe signal, wherein the pre-emphasis unit pre-emphasizes the data strobe signal output terminal during a second half clock cycle that corresponds to a preamble period of the data strobe signal.

21. The data strobe signal output buffer of claim 20, wherein the pre-emphasis unit includes:

a pre-emphasis control signal generating unit configured to generate a pre-emphasis control signal that is activated during a second half clock cycle that corresponds to a preamble period of the data strobe signal based on a preamble signal and a clock signal; and a pre-emphasis driver configured to pull up the data strobe signal output terminal based on the pre-emphasis control signal, the data strobe up signal and the data strobe down signal.

22. The data strobe signal output buffer of claim 20, wherein the pre-emphasis driver has a pull-up driving capability such that a voltage drop is decreased during a second half clock cycle that corresponds to a preamble period of the data strobe signal, the pull-up driving capability of the pre-emphasis driver being smaller than a pull-down driving capability of the output driver.

* * * * *